United States Patent
Kimura et al.

(10) Patent No.: US 6,870,260 B2
(45) Date of Patent: Mar. 22, 2005

(54) SEMICONDUCTOR MODULE

(75) Inventors: Junichi Kimura, Aichi (JP); Kazutoshi Tanaka, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 285 days.

(21) Appl. No.: 10/156,975

(22) Filed: May 29, 2002

(65) Prior Publication Data

US 2003/0098505 A1 May 29, 2003

(30) Foreign Application Priority Data

Nov. 26, 2001 (JP) ........................................ 2001-358788

(51) Int. Cl.$^7$ .............................................. H01L 23/34
(52) U.S. Cl. ........................ 257/724; 257/723; 257/531; 257/532; 257/780; 257/528
(58) Field of Search ................................ 257/723–724, 257/531–532, 780, 528

(56) References Cited

U.S. PATENT DOCUMENTS

| | | | | |
|---|---|---|---|---|
| 5,046,161 A | * | 9/1991 | Takada | 257/778 |
| 5,643,804 A | * | 7/1997 | Arai et al. | 438/155 |
| 6,144,108 A | * | 11/2000 | Ohizumi et al. | 257/793 |
| 6,365,962 B1 | * | 4/2002 | Liang et al. | 257/668 |
| 6,420,937 B1 | * | 7/2002 | Akatsuka et al. | 331/74 |
| 6,545,354 B1 | * | 4/2003 | Aoki et al. | 257/734 |
| 6,709,895 B1 | * | 3/2004 | Distefano | 438/115 |

* cited by examiner

*Primary Examiner*—Luan Thai
(74) *Attorney, Agent, or Firm*—RatnerPrestia

(57) ABSTRACT

Wiring part 12 is provided on one side 11a of semiconductor device 11. Wiring part 12 has at least one of interface circuit 13 connecting terminals on semiconductor device 11 and interface circuit 14 connecting terminal 18 on semiconductor device 11 and input/output terminal 19 in the semiconductor module.

13 Claims, 5 Drawing Sheets

US 6,870,260 B2

SEMICONDUCTOR MODULE

FIELD OF THE INVENTION

The present invention relates to a semiconductor module and more particularly to a semiconductor module having an interface circuit therein.

BACKGROUND OF THE INVENTION

As shown in FIG. 8, a conventional electronic device has circuit board 1, and semiconductor device 2, such circuit components as chip component 3 and air-core coil 4, and an external circuit (not shown) that are mounted on the circuit board. The circuit components constitute an interface circuit. The external circuit is connected to semiconductor device 2 via the interface circuit. Circuit board 1 requires a large area for mounting semiconductor device 2, the interface circuit, and the external circuit.

SUMMARY OF THE INVENTION

The present invention aims to provide a semiconductor module that eliminates the area for mounting interface circuits on a circuit board.

In order to accomplish this object, a semiconductor module in accordance with the present invention has the following components: a semiconductor device; and a wiring part that is provided on one side of the semiconductor device and substantially identical with the semiconductor device in size. The wiring part has input/output terminals for connection to external circuits. The wiring part further includes at least one of a first interface circuit for connection between the terminals on the semiconductor device and a second interface circuit for connection between the terminals on the semiconductor device and the input/output terminals.

Because the interface circuit is formed in the wiring part, the area for mounting the interface circuit on the circuit board is eliminated, and the electronic device is downsized accordingly. The semiconductor module can be connected to various kinds of external circuits by changing the interface circuit in the wiring part.

DETAILED DESCRIPTION OF EXEMPLARY EMBODIMENTS

Exemplary embodiments of the present invention are demonstrated hereinafter with reference to the accompanying drawings.

(First Embodiment)

Figure 1:
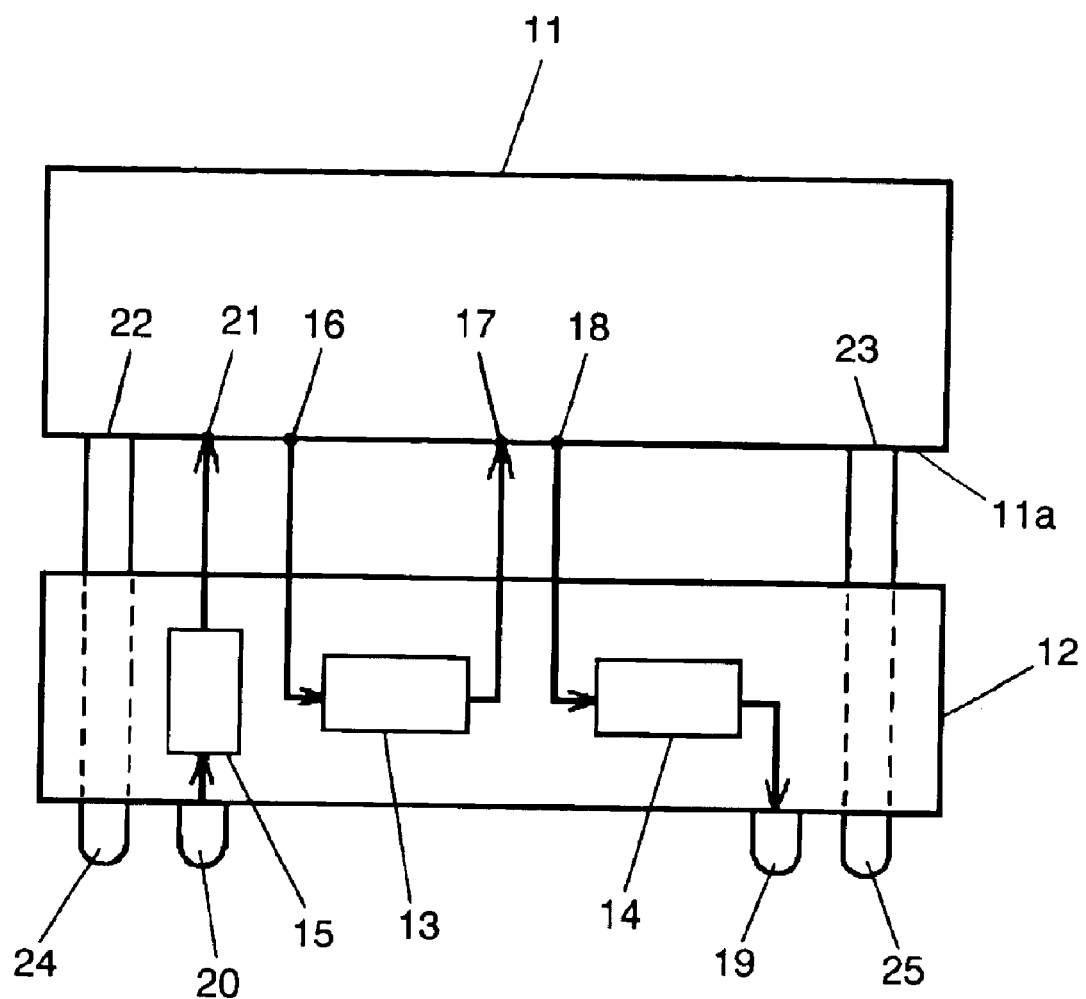
FIG. 1 illustrates a structure of a semiconductor module in accordance with a first exemplary embodiment of the present invention.

FIG. 1 illustrates a structure of a semiconductor module in accordance with the first embodiment of the present invention. Semiconductor device 11 has terminals 16, 17, 18, 21, 22 and 23 led out on one side 11a thereof. Provided on side 11a of the semiconductor device is wiring part 12 substantially identical with semiconductor device 11 in size. Wiring part 12 has input/output terminals 19, 20, 24 and 25 for connection to external circuits (not shown). Provided on wiring part 12 are circuits 13, 14, and 15. Circuit 13 connects terminals 16 and 17 on the semiconductor device. Circuit 14 connects terminal 18 on semiconductor device 11 and input/output terminal 19. Circuit 15 connects terminal 21 on semiconductor device 11 and input/output terminal 20. Terminals 22 and 23 connect directly to input/output terminals 24 and 25, respectively. Input/output terminals 19, 20, 24, and 25 are solder bumps.

The method of mounting the semiconductor module in accordance with the present invention onto the circuit board in an electronic device includes the following steps:
1) applying cream solder to the circuit board;
2) mounting the semiconductor module in a predetermined position on the circuit board; and
3) heating the semiconductor module and the circuit board in a reflow oven to melt the solder bumps and join the semiconductor module to the circuit board.

Because wiring part 12 has circuits 13, 14, and 15 as an interface circuit between the terminals on the semiconductor device and as interface circuits for connection to external circuits, the area for mounting the interface circuits on the circuit board are eliminated, and the electronic device are downsized accordingly. The semiconductor module in accordance with the present invention is easy to handle because the semiconductor device and the wiring part thereof are formed integrally. Moreover, even the same semiconductor device can be connected to various kinds of external circuits by changing circuit 14 or 15.

Figure 2:
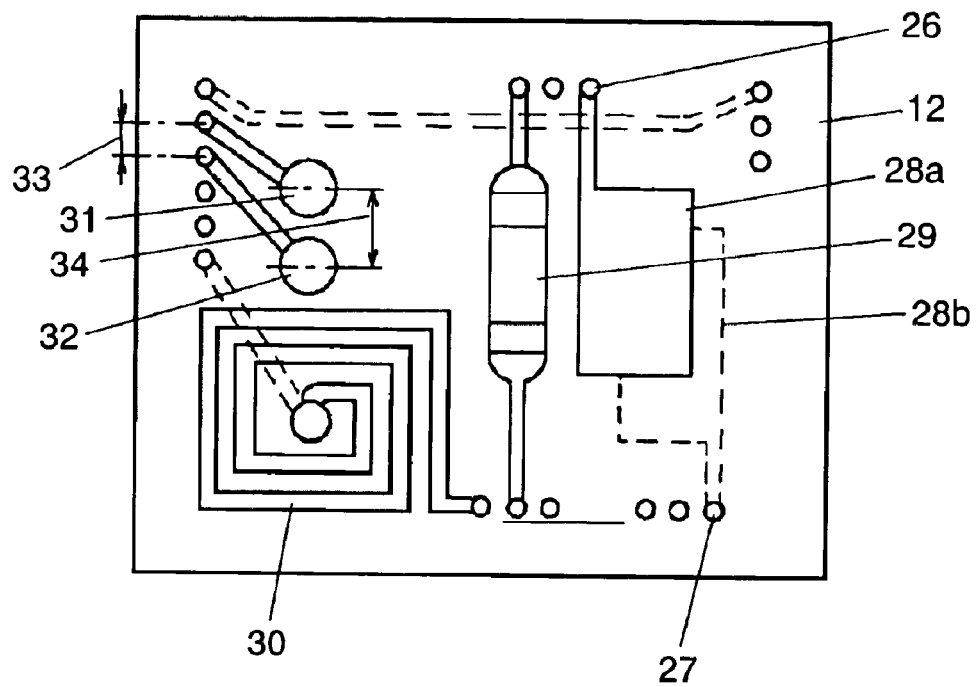
FIG. 2 shows an example of wiring patterns on a wiring part of the semiconductor module in accordance with the present invention.

FIG. 2 shows an example of wiring patterns on wiring part 12. Conductors 28a and 28b connected to terminals 26 and 27 on semiconductor device 11, respectively, form a capacitor. The broken line shows a conductor formed on another layer when wiring part 12 is formed of a plurality of layers. Chip component 29 is mounted on wiring part 12. Inductor 30 is also provided on wiring part 12. Because distance 33 between the terminals on semiconductor device 11 is typically so narrow as 0.15 mm or smaller, the terminals cannot be soldered directly onto the circuit board without any appropriate measures. On the other hand, distance 34 between input/output terminals 31 and 32 is 0.2 mm or larger so that the input/output terminals can be reflow soldered onto the circuit board. Then the terminals on semiconductor device 11 are soldered onto the circuit board via input/output terminals 31 and 32.

As described above, with the semiconductor module in accordance with the present invention, forming a capacitor, inductor and other components using wiring patterns can realize a thin electronic device. Conductors included in wiring part 12 can be formed at low cost by utilizing printing methods suitable for mass production, such as intaglio transfer or thick-film printing, etching, and evaporation. For insulating layers that are used between conductors when the conductors are formed of a plurality of layers, such a substrate material as prepreg, film made of such a material as polyimide can be used. Alternately, like the conductors, the insulating layers can be formed by intaglio transfer or thick-film printing.

Figure 3A:
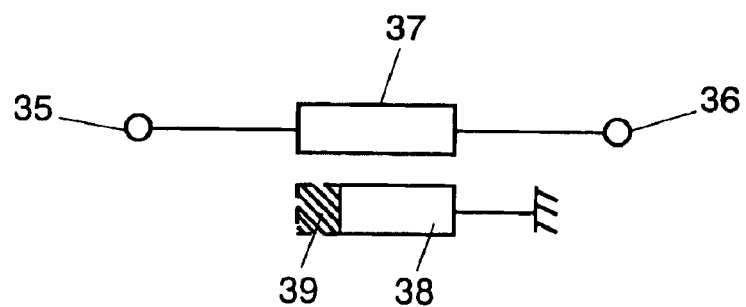
FIG. 3(a) shows laser trimming of a capacitor made of wiring patterns.
Figure 3B:
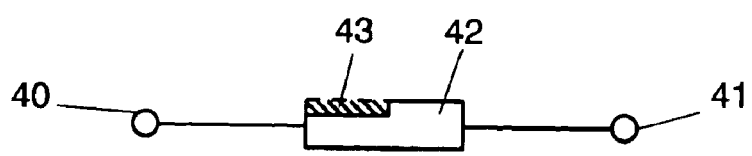
FIG. 3(b) shows laser trimming of an inductor made of a wiring pattern.

FIG. 3(a) shows an example of capacitance adjustment of a capacitor formed of wiring patterns. The capacitance between patterns 37 and 38 is adjusted by laser trimming part 39 of pattern 38 opposite to pattern 37. FIG. 3(b) shows an example of inductance adjustment of inductor 42 formed of a wiring pattern. The inductance of inductor 42 is adjusted by laser trimming part 43 of the wiring pattern. By adjusting the wiring patterns in this manner, the differences in the characteristic of semiconductor device 11 can be accommodated.

Figure 4:
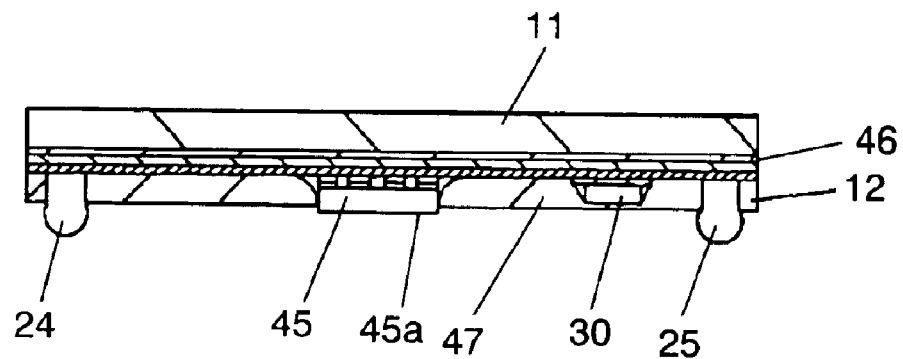
FIG. 4 is a sectional view of the wiring part of the semiconductor module of the present invention.

FIG. 4 is a sectional view of the semiconductor module of the present invention. Chip component 30 and semiconductor amplifier 45 are mounted on wiring part 12 provided on one side of semiconductor device 11, and are embedded in insulator 47. Top face 45a of semiconductor amplifier 45 is exposed from wiring part 12 for heat release. The heat release effect can be further improved by providing copper foil in a position in contact with top face 45a on the circuit board on which this semiconductor module is mounted. Wiring part 12 is composed of a plurality of layers. Ground layer 46 is provided between semiconductor device 11 and wiring part 12. Ground layer 46 reduces mutual interference between the circuits in wiring part 12 and the circuits in semiconductor device 11.

Figure 5:
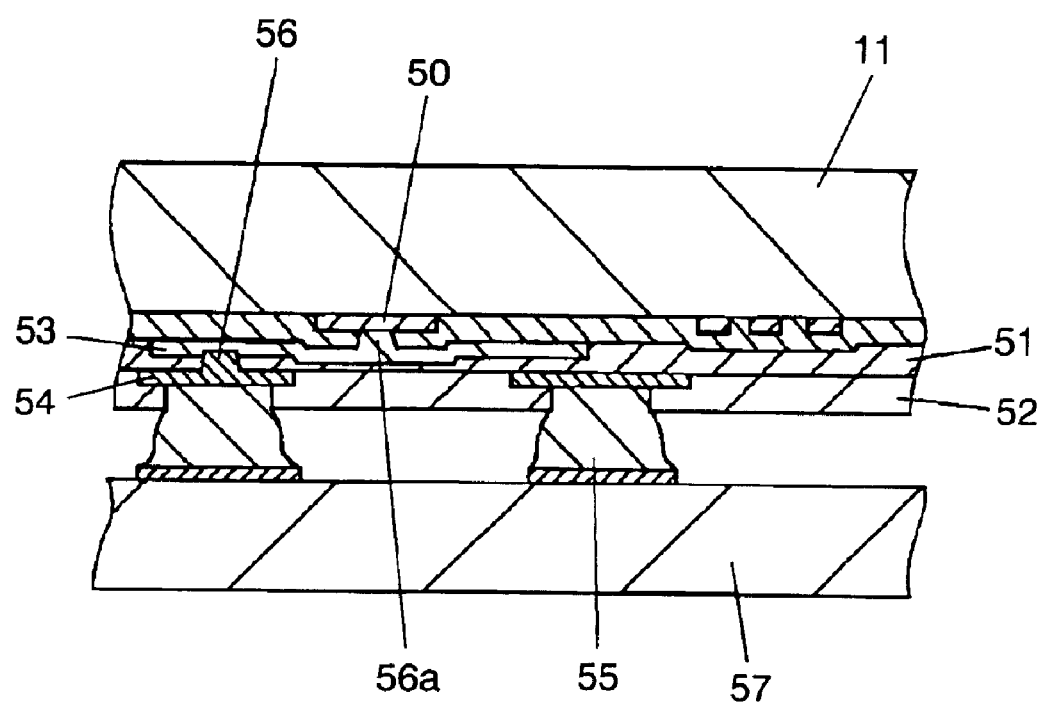
FIG. 5 is a partially enlarged sectional view of the wiring part of the semiconductor module of the present invention.

FIG. 5 is a sectional partial view of the semiconductor module of the present invention. Wiring layers 51 and 52 are formed in two layers. Pad 50 formed on semiconductor device 11 joins directly to conductor 53 in the first layer. Conductor 53 in the first layer, in turn, joins directly to conductor 54 in the second layer, which is located at a distance from pad 50. Provided on conductor 54 is solder bump 55 as an input/output terminal of the semiconductor module. Solder bump 55 and circuit board 57 are soldered with each other. Conductor 53 in the first layer, conductor 54 in the second layer, and connection between these conductors are made by pressing and heating of conductor paste, using such a method as intaglio transfer printing. Each of wiring layers 51 and 52 is made of a material having a different coefficient of linear expansion, and the coefficient of linear expansion sequentially increases from semiconductor device 11 to circuit board 57.

When the semiconductor module is exposed to a heat cycle, the joints thereof undergo stress according to the difference in the coefficients of linear expansion between semiconductor device 11 and circuit board 57. This stress is applied to all the joints and especially concentrated on weak parts. Typically, such a strong material as nickel is used for conductors 53 and 54. In addition, for the connection between conductor 53 and pad 50, and the connection between conductors 53 and 54, the conductors themselves are connected directly with each other, and thus these conductors are firmly joined. Therefore, the stress is concentrated on soldered joints. Because wiring layers 51 and 52 have different coefficients of linear expansion, wiring part 52 accommodates the difference in expansion and contraction between semiconductor device 11 and circuit board 58 that is caused by the heat cycle and the like, and relieves the stress applied to solder bumps 55. This can prevent solder cracks from occurring in soldered joints between semiconductor device 11 and circuit board 57. It is desirable to use a material having a coefficient of linear expansion substantially the same as that of circuit board 57, for the surface layer of the wiring part.

Because conductors 53 and 54 in wiring layers 51 and 52 are made by intaglio printing, the shape and width of the wiring pattern on the original printing plate can accurately be reproduced. The intaglio printing can improve the accuracy more than the etching technique, and thus variations in capacitance or inductance values can be reduced, when a capacitor or inductor is formed. Therefore, stable performance is rendered to a semiconductor module especially when the semiconductor module is used for high-frequency circuits. When a needle-like pure copper bump is used as connection bump 56, such a joint that uses the thin tall needle-like bump as a pillar and joins planar copper wiring to other planar copper wiring using the pillar can be made. The use of this joint allows joining conductors in ordinary atmospheric state. Thus, an inexpensive semiconductor module having excellent conductivity can be provided.

For a conventional semiconductor module, semiconductor device 11 is cut out from a wafer by dicing and other method, and joined to a printed board afterwards. In contrast, for the semiconductor module in accordance with the present invention, circuits are formed on wiring layers 51 and 52 before semiconductor device 11 is cut out from a wafer. When the circuit is made of a chip component as shown in FIG. 2 or 4, the chip component is mounted before semiconductor device 11 is cut out from the wafer. Because the semiconductor module is completed before being cut out from the wafer, the productivity thereof is excellent.

The joint between pad 50 and conductor 53 is made smaller than pad 50. This can stabilize the electrical resistance value of the joint because the area where connection bump 56a connects to pad 50 does not change even if printed wiring layer 51 is displaced. Conductors 53 and 54 are disposed inside of the contour of semiconductor device 11 at least by the total distance of displacements in printing and dicing. This prevents conductors 53 and 54 from being cut when the semiconductor module is divided by dicing after formation of wiring layers 51 and 52.

(Second Embodiment)

Figure 6:
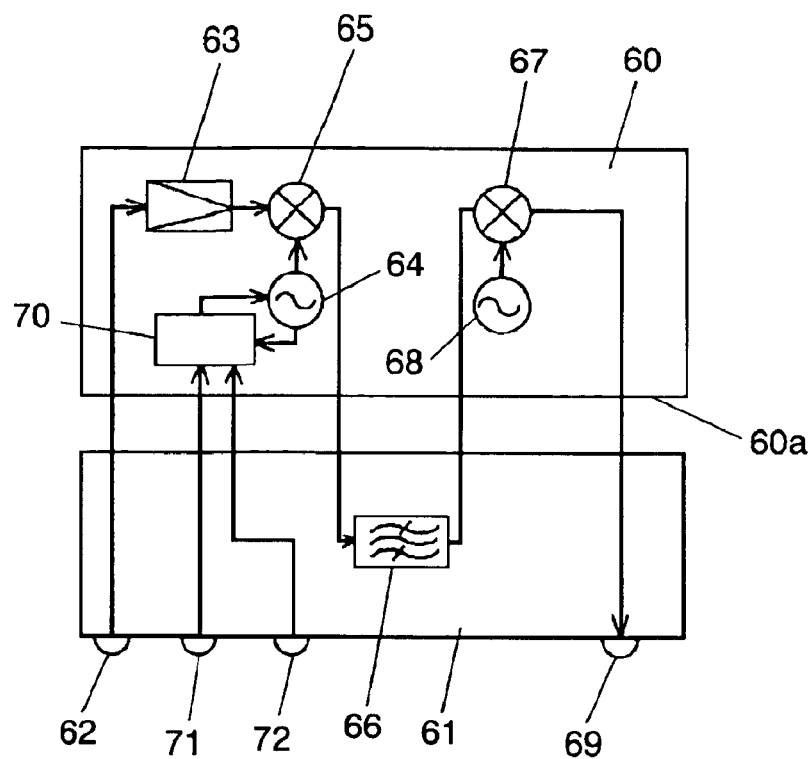
FIG. 6 illustrates a structure of a semiconductor module in accordance with a second exemplary embodiment of the present invention.

FIG. 6 illustrates a structure of a semiconductor module in accordance with the second embodiment of the present invention. Semiconductor device 60 forms a chip tuner. Semiconductor device 60 has wiring part 61 on one side 60a thereof. Input/output terminal 62 is connected to the input of high-frequency amplifying circuit 63 in semiconductor device 60. The output of high-frequency amplifying circuit 63 is connected to one input of mixer 65. The output of oscillator 64 is connected to the other input of mixer 65.

The output of mixer 65 is connected to band-pass filter 66 on wiring part 61. The output of band-pass filter 66 is connected to one input of mixer 67 in semiconductor device 60. The output of oscillator 68 is connected to the other input of mixer 67. The output of mixer 67 is connected to input/output terminal 69.

PLL circuit 70 is connected to oscillator 64 so as to form a loop. In addition, control signals thereof are connected to output terminals 71 and 72 and in communication with external circuits provided on a printed board (not shown). A filter and the like can be formed in wiring part 61 between input/output terminals 71 and 72 and PLL circuit 70. Band-pass filter 66 is used as an intermediate-frequency filter.

In this embodiment, because band-pass filter 66 is formed in wiring part 61, the semiconductor module can easily be changed to a tuner for another intermediate frequency by replacing band-pass filter 66.

When band-pass filter 66 is formed of an inductor and a capacitor that are made of wiring patterns, adjusting these patterns by laser trimming and other methods can provide a filter having excellent selectivity. Band-pass filter 66 can be a SAW filter and the like. In this case, the excellent frequency selectivity and damping property thereof can bring good high-frequency characteristics.

(Third Embodiment)

Figure 7:
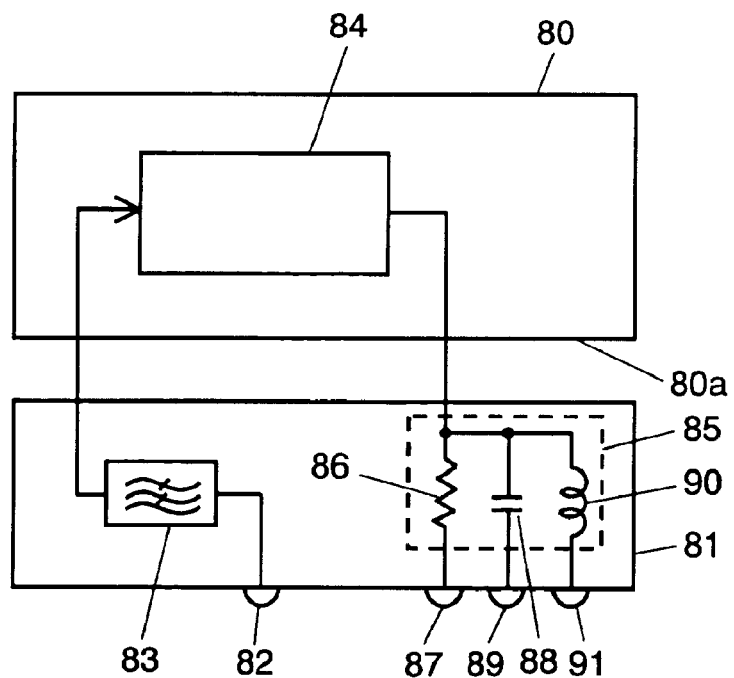
FIG. 7 illustrates a structure of a semiconductor module in accordance with a third exemplary embodiment of the present invention.
Figure 8:
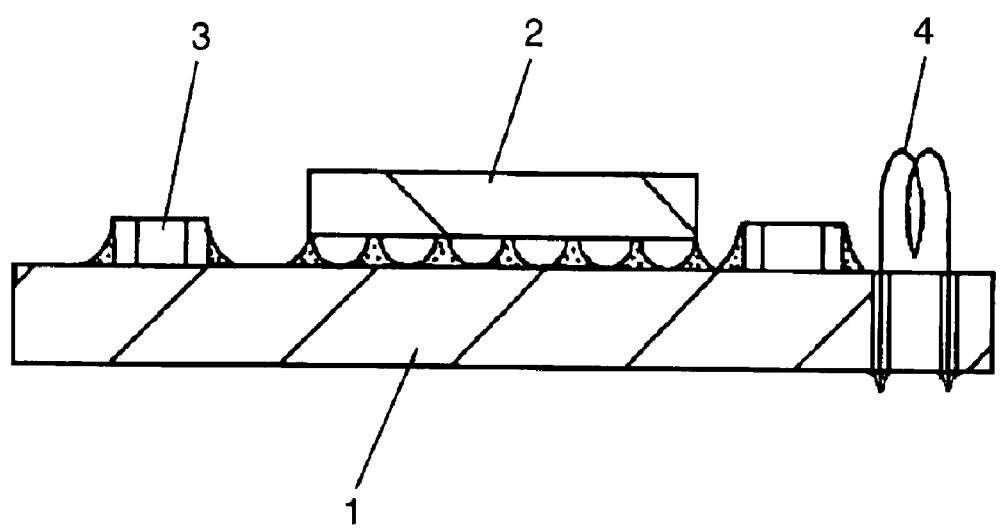
FIG. 8 is a sectional view of a conventional electronic device.

FIG. 7 illustrates a structure of a semiconductor module in accordance with the third embodiment of the present invention. On one side 80a of semiconductor device 80, wiring part 81 substantially identical with side 80a in size is provided. Input/output terminal 82 formed of a bump that is provided on wiring part 81 is connected to the input of electronic circuit 84 in semiconductor device 80, via low-pass filter 83 in wiring part 81. Low-pass filter 83 eliminates noise. When low-pass filter 83 is formed of an inductor and a capacitor that are made of wiring patterns, frequencies at which the filter is passed can be set to an optimal value by adjusting these patterns by laser trimming.

Distributor 85 connects the output of electronic circuit 84 to input/output terminals 87, 89, and 91, via chip resistor 86, capacitor 88 formed of wiring patterns, inductor 90 formed of a wiring pattern, respectively. In addition, the distribution ratio can be changed by adjusting inductor 90 and capacitor 88 by laser trimming.

What is claimed is:

1. A semiconductor module comprising:

a semiconductor device having a plurality of terminals; and a wiring part provided on one side of said semiconductor device and substantially identical with said semiconductor device in size, wherein said wiring part includes an input/output terminal for connection to an external circuit, at least one of a circuit connected between the terminals on said semiconductor device or a circuit connected between the terminals on said semiconductor device and the input/output terminal, and a conductor such that an area of contact between the conductor of the wiring part and a respective terminal of the semiconductor device is smaller than an area of the respective terminal of the semiconductor device.

2. The semiconductor module as set forth in claim 1, wherein the circuit in said wiring part includes one of an inductor or a capacitor made of a wiring pattern.

3. The semiconductor module as set forth In claim 2, wherein one of said inductor or said capacitor is structured so as to be adjustable by laser trimming.

4. The semiconductor module as set forth in claim 1, wherein the circuit in said wiring part includes a chip component.

5. The semiconductor module as set forth in claim 1, wherein the circuit in said wiring part is formed by intaglio transfer printing.

6. The semiconductor module as set forth in claim 1, wherein said wiring part includes a plurality of layers of conductors and insulators, the insulators include a connection bump formed directly on the conductor, and interfacial connection is performed by pressure welding of the connection bump to the conductor in an adjacent layer.

7. The semiconductor module as set forth in claim 1, wherein a coefficient of linear expansion of an insulator in said wiring part is larger than a coefficient of linear expansion of said semiconductor device, and smaller than a coefficient of linear expansion of a circuit board on which said semiconductor module is mounted.

8. The semiconductor module as set forth in claim 1, wherein said wiring part includes a plurality of layers of conductors and insulators, and coefficients of linear expansion of the insulators are larger in the layers farther from said semiconductor device.

9. The semiconductor module as set forth in claim 1, wherein a ground layer is interposed between said semiconductor device and the circuit formed on said wiring part.

10. The semiconductor module as set forth in claim 1, wherein said semiconductor device includes a tuner circuit, and said wiring part includes a filter circuit connected between the terminals on said semiconductor device.

11. The semiconductor module as set forth in claim 1, wherein said wiring part includes a filter circuit connected between the terminals on said semiconductor device and the input/output terminal.

12. The semiconductor module as set forth in claim 1, wherein said wiring part includes a distribution circuit connected between the terminals on said semiconductor device and the input/output terminal, and an output of said semiconductor device is externally supplied via the distribution circuit.

13. A semiconductor module comprising:

a semiconductor device having a plurality of terminals; and a wiring part provided on one side of the semiconductor device and including:

a plurality of input/output terminals for connection to an external circuit, at least one of a circuit connected between the terminals of the semiconductor device or a circuit connected between the terminals of the semiconductor device and the Input/output terminals of the wiring part, and a conductor electrically coupling with a respective one of the input/output terminals such that an area of contact between the conductor of the wiring part and a respective terminal of the semiconductor device is smaller than an area of the respective terminal of the semiconductor device.

* * * * *

UNITED STATES PATENT AND TRADEMARK OFFICE
CERTIFICATE OF CORRECTION

PATENT NO. : 6,870,260 B2
DATED : March 22, 2005
INVENTOR(S) : Junichi Kimura et al.

It is certified that error appears in the above-identified patent and that said Letters Patent is hereby corrected as shown below:

Column 5,
Line 43, "In" should read -- in --.

Column 6,
Line 43, "Input/output" should read -- input/output --.

Signed and Sealed this

Thirteenth Day of December, 2005

JON W. DUDAS
*Director of the United States Patent and Trademark Office*